(12) United States Patent
Misra

(10) Patent No.: US 6,898,084 B2
(45) Date of Patent: May 24, 2005

(54) THERMAL DIFFUSION APPARATUS

(75) Inventor: Sanjay Misra, Shoreview, MN (US)

(73) Assignee: The Bergquist Company, Chanhassen, MN (US)

( * ) Notice: Subject to any disclaimer, the term of this patent is extended or adjusted under 35 U.S.C. 154(b) by 0 days.

(21) Appl. No.: 10/621,697

(22) Filed: Jul. 17, 2003

(65) Prior Publication Data
US 2005/0013119 A1 Jan. 20, 2005

(51) Int. Cl.$^7$ .............................. H01L 23/50; H05K 7/20
(52) U.S. Cl. ...................... 361/710; 361/709; 361/719; 257/706
(58) Field of Search .................. 361/697, 702–719; 257/717–722

(56) References Cited

U.S. PATENT DOCUMENTS

| 4,283,464 A | * | 8/1981 | Hascoe .................... 428/594 |
| 4,415,025 A | | 11/1983 | Horvath |
| 4,782,893 A | * | 11/1988 | Thomas ................... 165/185 |
| 5,132,776 A | * | 7/1992 | Hanada et al. ............. 257/729 |
| 5,159,531 A | | 10/1992 | Horvath et al. |
| 5,224,030 A | | 6/1993 | Banks et al. |
| 5,270,902 A | | 12/1993 | Bellar et al. |
| 5,316,080 A | | 5/1994 | Banks et al. |
| 5,494,753 A | * | 2/1996 | Anthony ................... 428/408 |
| 5,660,917 A | * | 8/1997 | Fujimori et al. .......... 428/195.1 |
| 5,886,407 A | * | 3/1999 | Polese et al. ............. 257/706 |
| 5,958,572 A | * | 9/1999 | Schmidt et al. .......... 428/320.2 |
| 6,064,573 A | | 5/2000 | Morton |
| 6,372,997 B1 | | 4/2002 | Hill et al. |
| 6,407,922 B1 | | 6/2002 | Eckblad et al. |
| 6,411,513 B1 | | 6/2002 | Bedard |
| 6,424,531 B1 | | 7/2002 | Bhatti et al. |
| 6,498,726 B2 | | 12/2002 | Fuller et al. |
| 6,680,015 B2 | * | 1/2004 | McCullough ................ 264/105 |
| 6,758,263 B2 | * | 7/2004 | Krassowski et al. ........ 165/185 |
| 2002/0015288 A1 | | 2/2002 | Dibene, II et al. |
| 2002/0023732 A1 | * | 2/2002 | Graf et al. .................. 165/80.3 |
| 2002/0023733 A1 | | 2/2002 | Hall et al. |
| 2002/0195229 A1 | | 12/2002 | Hsieh et al. |
| 2004/0036161 A1 | * | 2/2004 | Williams et al. ............. 257/706 |

FOREIGN PATENT DOCUMENTS

| DE | 3825981 A1 | * | 2/1990 | .......... H01L/23/36 |
| JP | 02256260 A | * | 10/1990 | .......... H01L/23/06 |
| JP | 04099051 A | * | 3/1992 | .......... H01L/23/36 |

* cited by examiner

Primary Examiner—Anatoly Vortman
(74) Attorney, Agent, or Firm—Haugen Law Firm PLLP

(57) ABSTRACT

An apparatus for operably conveying heat away from a heat source includes a thermally conductive substrate having a thickness defining a planar boundary thereof, and an insert portion disposed in the substrate and being positioned so as not to extend beyond the planar boundary. The insert portion is a material having a thermal conductivity value of at least 1.5 times that of the substrate material along at least two axial directions, with one of such axial directions extending substantially perpendicularly to first and second opposed sides of the substrate.

9 Claims, 2 Drawing Sheets

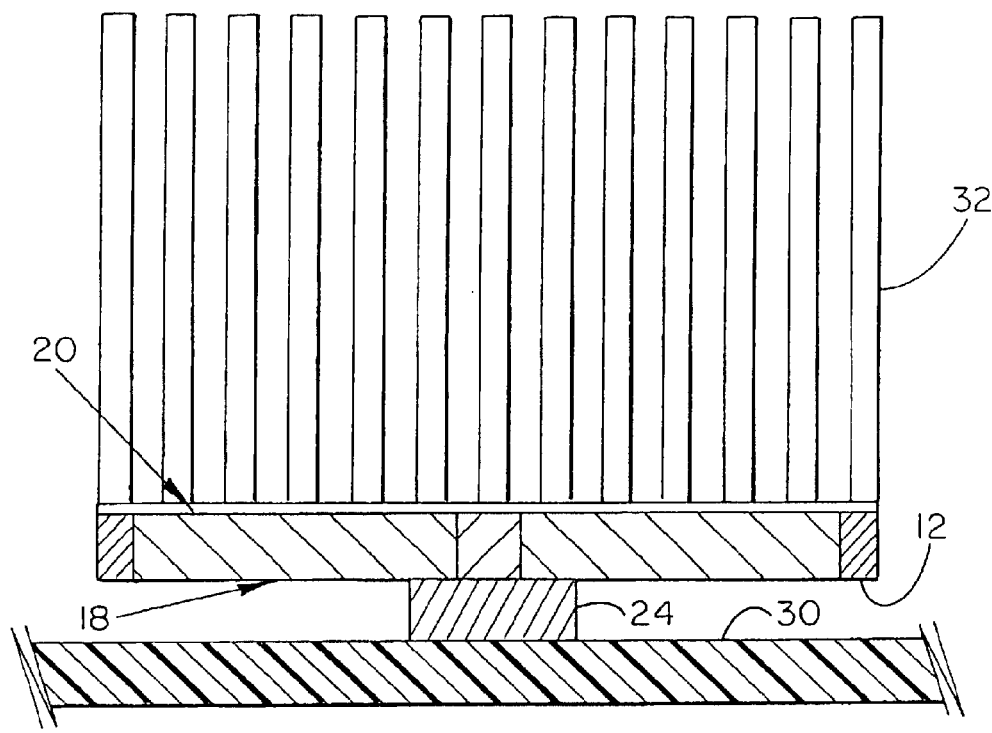

THERMAL DIFFUSION APPARATUS

FIELD OF THE INVENTION

This invention relates to thermal draw devices generally and more particularly to a heat spreader apparatus for efficiently removing and diffusing heat from a localized source to a relatively large surface area body for subsequent dissipation therefrom through various heat exchange techniques. In particular, the present invention relates to highly thermally conductive materials utilized as inserts into conventional thermal diffusion bodies in a specific pattern so as to greatly expedite thermal diffusion from a localized heat source.

BACKGROUND OF THE INVENTION

In many electrical applications, and particularly in semiconductor systems, devices are utilized for assisting in drawing excess heat away from the heat-generating device, such as the microprocessor semi-conductor. Such thermal diffusion devices are important to electronic applications, in that many electronic components lose efficiency and performance in an elevated temperature environment. Accordingly, it is well known to utilize devices such as fans, heat sinks, and the like which are useful in removing thermal energy from in and around the respective electronic components.

Solid and semi-solid heat sinks have been recognized for their utility and cost-effectiveness in acting as thermal draws from respective electronic components. Such heat sinks are typically solid blocks of thermally conductive material such as various metals, which block of material is thermally coupled to the heat-generating device through a thermal paste or the like. In some cases, the heat sink elements incorporate a plurality of thin protrusions that are integrally formed with the block of material so as to provide a substantially increased surface area in which to expose excess thermal energy to ambient air. Heat transfer therefore occurs at the interface between the heat sink material and the heat-receiving fluid, which is most commonly air. To increase the effectiveness of the heat transfer from the heat sink to the surrounding air, electronically-driven fans are sometimes incorporated to create a continuous flow of air over the heat exchange surfaces of the respective heat sinks.

In some applications, a multi-layer heat sink structure is utilized for forming both a thermal interface between the heat-generating device, and a heat exchange surface that is typically exposed to cooling fluid, such as air. A common problem encountered in conventional heat sink devices is in effectively removing relatively high levels of thermal energy away from a relatively small area. Such is typically the case with reference to integrated circuits and, particularly, semiconductors and microprocessors, which have become extremely compact in size while producing a relatively large amount of thermal energy. To most effectively maintain optimum performance of the respective electronic components, therefore, a relatively large amount of thermal energy must be drawn away from an area that is typically of a size on the order of 0.125 $in^2$. Conventional heat sink devices, however, are limited in the amount of thermal energy they are able to transport away from the heat source by their respective thermal conductivities, as well as the thermal contact area between the heat sink and the heat-generating device. In many cases, heat sinks carry nowhere near their respective heat transfer capacities, due to the fact that only a small portion of the respective heat sink bodies are utilized in transferring thermal energy away from the heat-generating device. In other words, the relatively small heat-generating device, such as a semi-conductor, creates a thermal footprint in the thermally-coupled heat sink, which thermal footprint has an area substantially similar to the thermal contact area between the heat sink and the heat-generating device. In most conventional heat-sink devices, the thermal energy is transported through the material of the heat sink in all directions and at equal rates. In most cases, however, conventional heat sinks are significantly larger than electronic components from which thermal energy is transferred to effectively handle and dissipate the heat generated therefrom. As such, the highest degree of heat transfer through the heat sink is generally focused at the portion of the heat sink physically closest to the thermal footprint generated by the heat-generating device. Such a focused location of maximum heat transfer generally compromises the overall effectiveness of the heat sink, in that only the focused area of the heat sink carries and transfers its maximum capacity rate of thermal energy, while the remainder of the heat sink carries and transfers far less than its thermal transfer capacity.

In addition, recent innovations in the electronic arts have developed electronic components of ultra-high performance. Such performance, however, typically results in an increased degree of thermal output from the respective electronic device. Conventional heat sinks often times become "saturated" with thermal energy at certain focused locations, and therefore fail to adequately draw a sufficient amount of thermal energy from such high-output electronic components so as to maintain a relatively steady-state temperature operating environment for such electronic components.

Some attempts have been made to develop thermal dissipation devices that are capable of sufficiently drawing thermal energy away from respective electronic components. However, such devices commonly utilize a relatively large amount of expensive, highly thermally-conductive material such as diamond, and are not useful in a wide variety of heat-sinking applications.

It is therefore a principle object of the present invention to provide a thermal diffusion apparatus that is capable of transmitting a relatively large amount of thermal energy therethrough while embodying a configuration that is adaptable to a wide variety of thermal dissipation applications.

It is a further object of the present invention to provide a thermal diffusion apparatus having means for rapidly transmitting relatively large amounts of thermal energy in at least two directions from a heat source.

It is a still further object of the present invention to provide a thermal diffusion apparatus which enable more efficient utilization of an entire volume of a thermal transmission body.

It is a still further object of the present invention to provide a relatively planar thermal diffusion apparatus incorporating an insert portion having a relatively high thermal conductivity value, which insert portion is effective in quickly transferring thermal energy both through the thermal diffusion apparatus, as well as to portions of the thermal diffusion apparatus distal to the heat source.

It is another object of the present invention to provide a thermal diffusion apparatus having enhanced thermal transfer properties without substantially increasing the cost of conventional heat sink structures.

SUMMARY OF THE INVENTION

By means of the present invention, an apparatus is provided for enhanced heat transfer from a heat-generating electronic component. In particular, the thermal diffusion apparatus of the present invention both accelerates and renders more efficient the heat transfer from a heat generating device to a heat sink by quickly diffusing thermal energy away from a relatively localized thermal contact point adjacent the heat generating device to the heat sink and to portions of a diffusion apparatus distal to such localized thermal contact point. Thus, the apparatus of the present invention more effectively distributes thermal energy radially and within a planar boundary, such that a significantly greater extent of an operably coupled heat sink may be effectively utilized to dissipate such thermal energy from the heat generating device.

In a particular embodiment of the present invention, the thermal diffusion apparatus includes a thermally conductive substrate having first and second opposed sides and a thickness defined between such first and second opposed sides, with the thickness of the substrate forming a planar boundary thereof. The apparatus further includes an insert portion disposed in the substrate and is positioned so as not to extend beyond the planar boundary, with the insert portion having a thermal conductivity of at least 1.5 times that of the substrate along at least two axial directions, with one of such axial directions extending substantially perpendicularly to the first and second opposed sides. The substrate is preferably operably disposed adjacent to a heat source such that at least a portion of the insert portion is in immediate thermal contact with the heat source.

In some embodiments of the present invention, the insert portion has a thermal conductivity value of at least 2.5 times that of the substrate along at least two of such axial directions.

BRIEF DESCRIPTION OF THE DRAWINGS

FIG. 3 is a cross-sectional view of a thermal diffusion apparatus of the present invention.

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures which are intended to be representative of various possible configurations of the invention. Other embodiments and aspects of the invention are recognized as being within the grasp of those having ordinary skill in the art.

Figure 1:
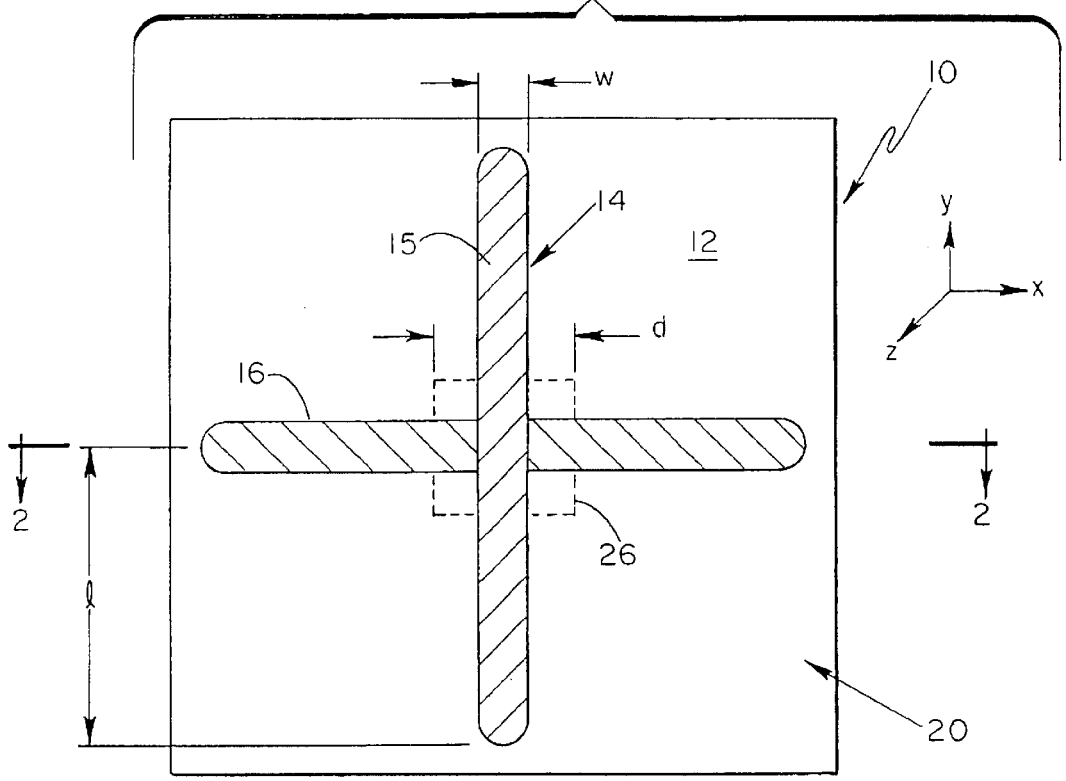
FIG. 1 is a top view of a thermal diffusion apparatus of the present invention.
Figure 2:
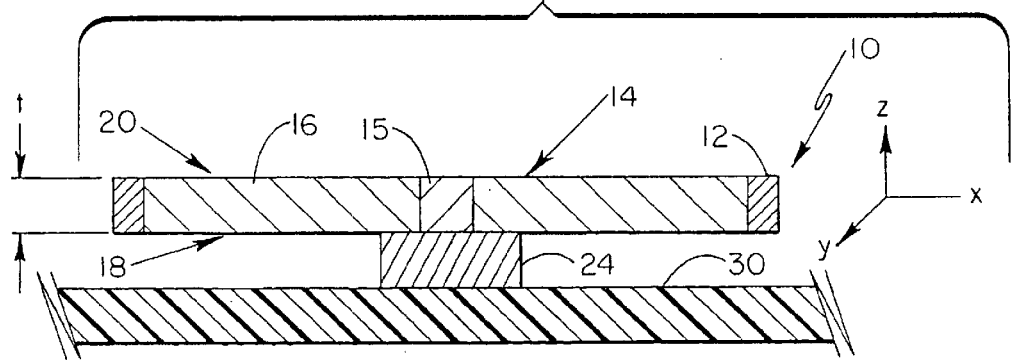
FIG. 2 is a cross-sectional side view of a thermal diffusion apparatus of the present invention.

With reference now to the attached drawing figures, and first to the top view of FIG. 1, thermal diffusion apparatus 10 is shown including substrate 12 and insert portion 14 disposed therein. As illustrated in FIG. 2, substrate 12 includes a first side 18 and a second generally opposing side 20 defining a thickness "t" therebetween. The thickness "t" of substrate 12 defines a planar boundary thereof.

As illustrated in FIG. 2, insert portion 14 is preferably disposed in substrate 12 so as not to extend beyond the planar boundary of substrate 12 defined by thickness "t". As will be described in greater detail below, it is an important aspect of the present invention that insert portion 14 be configured so as not to extend beyond the planar boundary of substrate 12. In particular, apparatus 10 of the present invention is specifically configured so as to be adaptable to a wide variety of thermal dissipation applications. In other words, a substantially planar configuration for apparatus 10 is preferred for its ease of applicability to a wide variety of heat generating devices, as well as a wide variety of heat sink bodies.

In preferred embodiments of the present invention, apparatus 10 is operably and thermally coupled to a heat generating component such as at 24 for thermal diffusion therefrom. Heat-generating component 24 may be, for example, a microprocessor, a semi-conductor element, or any other heat-producing electronic component that is typically mounted on a printed circuit board 30 or the like. Apparatus 10 may be directly coupled to component 24, but is more typically thermally coupled to component 24 via a thermally-conductive adhesive or wax material (not shown) that are well known in the art. Such an adhesive or wax material forms a thermally conductive interface between apparatus 10 and component 24. In preferred embodiments of the present invention, however, apparatus 10 is operably positioned in as near proximity to component 24 as possible to minimize thermal impedance effects of the thermal interface material.

In operation, heat-generating component 24 generates excess thermal energy, such that the body of component 24, as well as the immediately surrounding environment thereof is driven toward elevated temperatures. In the embodiment illustrated in FIG. 2, at least a portion of such excess thermal energy is conducted through the laws of thermal dynamics to a body having a relatively greater thermal potential than component 24. Accordingly, excess thermal energy is drawn through a thermally conductive interface between apparatus 10 and component 24, and correspondingly into apparatus 10. Such thermal transfer results in a thermal footprint 26 at first surface 18 of apparatus 10, which thermal footprint generally corresponds to the thermally transmissive surface area at the interface between apparatus 10 and component 24. Preferably, therefore, apparatus 10 distributes and diffuses the thermal energy imparted onto it at thermal footprint 26.

In preferred embodiment of the present invention, and as illustrated in FIG. 3, substrate 12 of apparatus 10 is preferably operably coupled to a heat sink 32, which preferably includes a relatively large surface area for effective heat dissipation therefrom. In the embodiment illustrated in FIG. 3, heat sink 32 is preferably a distinct finned element that is operably and thermally coupled to second surface 20 of substrate 12 through a thermally conductive adhesive or wax material (not shown). In other embodiments, however, heat sink 32 may be integrally formed with, and a portion of, apparatus 10. Of course, a wide variety of heat sink configurations are contemplated for use in and with the present invention, with the only limitation of the configuration of heat sink 32 being its adaptability to second surface 20 of substrate 12.

As described above, a desired functionality for apparatus 10 is to quickly and efficiently draw excess thermal energy from component 24, and to transfer such thermal energy to heat sink 32 for ultimate dispersal therefrom. In conventional systems of the prior art, thermal energy drawn from thermal footprint 26 is not effectively distributed to portions of the heat spreader plate distal from thermal footprint 26. As a result, transfer of thermal energy in prior art systems has been undesirably confined to a relatively small portion of the thermally coupled heat sink which therefore diminishes overall efficiency and efficacy of a thermal draw system.

Apparatus 10 of the present invention overcomes such drawbacks by incorporating a relatively highly thermally conductive insert portion 14 in substrate 12, and particularly adjacent to thermal footprint 26 in substrate 12. Preferably, at least a portion of insert portion 14 is in immediate thermal contact with the heat source of component 24, in that at least a portion of insert portion 14 is positioned in substrate 12 at thermal footprint 26. Accordingly, thermal energy imported upon substrate 12 at footprint 26 is quickly and efficiently dispersed throughout substrate 12 via highly thermally conductive insert portion 14. In addition, insert portion 14 acts to quickly draw excess thermal energy from thermal footprint 26 at first surface 18 of substrate 12 toward second surface 20 thereof for subsequent transfer to heat sink 32. Such expedient heat transfer draws sufficient excess thermal energy away from component 24 so as to prevent component 24 from overheating.

Insert portion 14 is preferably fabricated from a relatively highly thermally conductive material having a thermal conductivity of at least 1.5 times that of substrate 12 in at least two axial directions of insert portion 14. A particular example of a material useful in insert portion 14 is highly oriented pyrolytic graphite (HOPG), which has an anisotropic thermal conductivity characteristic. Specifically, HOPG has a thermal conductivity value of 1500 watts/m-k in two axial directions, and about 50 watts/m-k in the third axial direction. By comparison, materials typically utilized for substrate 12 have thermal conductivity values between about 100 and 400 watts/m-k.

In embodiments of the present invention incorporating HOPG for insert portion 14, the HOPG material is preferably oriented so as to provide relatively high levels of thermal conductivity along the "z" axis, and one of the "x" or "y" axes as illustrated in FIGS. 1–2. In such a manner, thermal energy passing from component 24 to apparatus 10 is quickly drawn from first side 18 toward second side 20 along the z axis, as well as along one of the x or y axes to further distribute thermal energy to distal portions of substrate 12.

In a particularly preferred embodiment of the present invention, insert portion 14 incorporates at least two distinct pieces 15, 16 of the HOPG material, which distinct pieces 15, 16 are specifically oriented to provide a desired level of thermal spreading to portions of substrate 12 distal from thermal footprint 26. In particular, HOPG insert piece 15 is oriented to provide about 1500 watts/m-k of thermal conductivity along the y and z axes, while HOPB insert piece 16 is oriented so as to provide 1500 watts/m-k along the x and z axes. Through such an embodiment, thermal energy at thermal footprint 26 is quickly spread in all three axial directions throughout substrate 12. Consequently, thermal transfer from heat-generating component 24 to heat sink 32 is made considerably more efficient than that of conventional systems.

Due to the relatively high cost of highly thermally conductive materials, it is a preferred aspect of the present invention to minimize the amount of such material incorporated into apparatus 10, while maintaining a desired degree of thermal diffusion properties. As such, it has been determined that specific configurations of insert portion 14 provide the most preferred balance between cost and performance. In particular, insert portion 14 preferably includes one or more arms extending radially outwardly within the planar boundary of substrate 12 and from a location in substrate 12 immediately adjacent to, and in thermal contact with, thermal footprint 26. Most preferably, at least a portion of insert portion 14 is superimposed over thermal footprint 26 at first side 18 of substrate 12. Though insert portion 14 of the present invention is illustrated as extending substantially through thickness "t" of substrate 12, it is contemplated by the present invention to extend insert portion 14 between about 10% and 100% through thickness "t" from first side 18 of substrate 12.

In preferred embodiments, the respective radial arms of insert portion 14 have a lateral width "w" of between about 30% and about 70% of diameter "d" of thermal footprint 26 generated by component 24. In addition, the length "1" of the respective radial arms of insert portion 14 is greater than about 150% of diameter "d" of thermal footprint 26. While the above dimensions provide preferred configurations for the present invention, it is contemplated herein that insert portion 14 may be configured as desired within substrate 12 for optimal performance with respect to particular applications.

As described above, insert portion 14 is preferably fabricated from a highly thermally conductive material having a thermal conductivity value of at least 1.5 times that of substrate 12, and more preferably at least 2.5 times that of substrate 12. A particularly preferred material for use in insert portion 14, as described above, is HOPG, which provides a high level of thermal conductivity while being relatively easy to manufacture and manipulate into desired configurations. However, a variety of highly thermally conductive materials may be utilized in insert portion 14 in the present invention. Such materials include, for example, diamond, pitch-based graphite, aluminum, copper, and copper-tungsten alloy.

Substrate 12 of the present invention is preferably fabricated from commonly-utilized thermally conductive materials such as copper, copper-tungsten alloy, aluminum, silver, gold, alumina, aluminum nitrite, boron nitrite, epoxy, and various engineering thermoplastics. It is a preferred aspect of the present invention that the material selected for insert portion 14 have a thermal conductivity value of at least 1.5 times that of the material selected for substrate 12.

Various manufacturing techniques may be utilized to permanently secure insert portion 14 within substrate 12 for continuous use as a thermal diffusion apparatus that is operably and thermally coupled to one or more selected heat generating devices. One method for securing insert portion 14 to substrate 12 is via high temperature, and preferably thermally conductive, adhesives. However, insert portion 14 may be welded, soldered, or otherwise affixed within pre-cut grooves or apertures in substrate 12.

In some embodiments of the present invention, substrate 12 includes a plurality of insert portions 14 disposed therein, such that a single substrate 12 may be applied to a plurality of heat generating devices 24. In such a manner, substrate 12 may include one or more distinct insert portions 14, as required for particular applications.

The following examples illustrate the enhanced effectiveness of thermal transfer achieved through the utilization of the apparatus of the present invention, as compared to conventional thermal transfer devices, by reducing the thermal impedance between a heat generating device and a heat sink/thermal dissipation structure. Such examples are by no means limiting in scope, in that a wide variety of materials and configurations are contemplated for use by the present invention.

EXAMPLE I

To form the thermal diffusion apparatus, a 1.5"×1.5"×0.08" copper substrate and 1"×0.08"×0.08" highly oriented pyrolytic graphite insert portions were obtained.

Appropriately-sized slots were milled in the copper substrate, such that two pyrolytic graphite inserts were positioned and secured in the resultant opening within the copper substrate with Bergquist Sterling 7500™ thermally conductive grease acting as the interface between the inserts and the copper substrate. The inserts were positioned in a substantially perpendicular "cross" orientation, with the respective mid-points of the insert portions substantially intersecting with one another. The insert portions were oriented in the copper substrate such that a highly thermally conductive direction characteristic of the insert portions were oriented in a plane perpendicular to a plane of the substrate.

A Motorola IRF-840, TO-220 package, acting as the heat source, was operated at 60 watts and coupled to the thermal diffusion apparatus described above via Bergquist Sterling 7500™ grease. The heat-generating component was positioned on a first side of the thermal diffusion apparatus and superimposed over the intersection of the two pyrolytic graphite insert portions. To the opposing side of the thermal diffusion apparatus was attached a water-circulating chiller via Bergquist Sterling 7500™ grease.

Thermocouples were operably secured to the chiller and the heat-generating component for respective measurement of thermal output and input from the heat-generating component to the chiller. A similar arrangement was provided for comparison purposes, wherein the thermal diffusion apparatus had no insert portions disposed therein, and was simply a 1.5"×1.5"×0.08" copper substrate.

The thermal impedance of the respective thermal diffusion structures were calculated by measuring the temperature differences between the heat-generating device and the chiller, and dividing the result by the power generated by the TO-220 package.

| DIFFUSER | THERMAL IMPEDANCE (° C./W) |
|---|---|
| Copper only | 0.52 |
| Copper with inserts | 0.48 |

EXAMPLE II

Thermal diffusion structures with integrated finned heat sink configurations were provided. The heat sink devices were fabricated from aluminum and were 2.4"×3.2"×0.75" in size, with one of the heat sink devices having highly oriented pyrolytic graphite insert portions in an upper side thereof. The heat sink device incorporating insert portions included two such portions, each of which were 1"×0.12"×0.08" in dimension, the two insert portions being positioned along the upper surface of the heat sink in a substantially perpendicular "cross" pattern, with the mid-points of each of the insert portions substantially intersecting with one another. To assist in removing heat from the heat sink devices, a 9.18 CFM maximum air flow fan was operated at 4500 rpm to direct such air flow across the fins of the heat sink elements.

TO-220 packages were secured to respective upper surfaces of the heat sink structures via Bergquist Sterling 7500™ grease. The TO-220 package was placed on the insert portion-containing heat sink apparatus at a location substantially superimposing the intersection of such insert portions.

Temperature measurements were conducted at the TO-220 package (heat generating device) and the distal ends of the respective heat sink fins. Thermal impedance was measured and calculated as described above.

| HEAT SINK | THERMAL IMPEDANCE (° C./W) |
|---|---|
| Aluminum only | 0.83 |
| Aluminum with insert portions | 0.73 |

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different devices and that various modifications can be accomplished without departing from the scope of the invention itself.

What is claimed is:

1. An apparatus for operably conveying heat away from a heat source, said apparatus comprising:
    (a) a thermally conductive substrate having first and second opposed sides and a thickness defined between said first and second opposed sides, the thickness of said substrate forming a planar boundary thereof; and
    (b) an insert portion disposed in said substrate and being positioned so as not to extend beyond said planar boundary, said insert portion having a thermal conductivity value of at least 1.5 times that of said substrate along at least two axial directions, with one of such axial directions extending substantially perpendicularly to said first and second opposed sides, said substrate being operably disposed adjacent to the heat source such that at least a portion of said insert portion is in immediate thermal contact with such heat source, said insert portion including one or more arms extending radially outwardly from a first location in said substrate that is immediately adjacent to, and in thermal contact with, the heat source, said one or more radial arms extending within said planar boundary.

2. An apparatus as in claim 1 wherein said insert portion has a thermal conductivity value of at least 2.5 times that of said substrate along at least two of such axial directions.

3. An apparatus as in claim 1 wherein said substrate is selected from the group consisting of copper, copper tungsten alloy, aluminum, silver, gold, alumina, aluminum nitride, boron nitride, epoxy, and engineering thermoplastics.

4. An apparatus as in claim 1 wherein said insert portion is selected from the group consisting of diamond, highly oriented pyrolytic graphite, pitch based graphite, aluminum, copper, and copper tungsten alloy.

5. An apparatus as in claim 1 wherein said insert portion extends at least 10% through said substrate thickness from said first side thereof.

6. An apparatus as in claim 1 wherein said radial arms of said insert portion have a lateral width of between about 30% and about 70% of the diameter of a thermal footprint generated by the heat source.

7. An apparatus as in claim 1 wherein said radial arms of said insert portion have a length of greater than about 150% of the diameter of a thermal footprint generated by the heat source.

8. An apparatus as in claim 1 wherein said substrate is a generally planar body adapted for securement to various heat generating devices.

9. An apparatus as in claim 1 wherein said substrate includes a plurality of fins extending outwardly from said second surface thereof, with said first surface of said substrate being operably coupled to the heat source.

\* \* \* \* \*